US006885684B2

(12) United States Patent
Ichino

(10) Patent No.: US 6,885,684 B2
(45) Date of Patent: Apr. 26, 2005

(54) LASER CONTROL CIRCUIT AND LASER MODULE

(75) Inventor: Moriyasu Ichino, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 163 days.

(21) Appl. No.: 10/420,969

(22) Filed: Apr. 23, 2003

(65) Prior Publication Data

US 2003/0231665 A1 Dec. 18, 2003

(30) Foreign Application Priority Data

Apr. 25, 2002 (JP) .................................... P2002-124582

(51) Int. Cl.[7] .............................................. H01S 3/00
(52) U.S. Cl. ............................ 372/38.01; 372/29.01; 372/29.011; 372/29.014; 372/32; 372/38.1; 372/38.02
(58) Field of Search .................... 372/29.01, 29.011, 372/29.014, 32, 38.1, 38.01, 38.02

(56) References Cited

U.S. PATENT DOCUMENTS 6,212,210 B1 * 4/2001 Serizawa ...................... 372/32
6,477,190 B1 * 11/2002 Komiyama et al. ........... 372/34
6,529,534 B1 * 3/2003 Yasuda ........................ 372/32
2002/0172243 A1 * 11/2002 Ono et al. ................ 372/29.02
2003/0043865 A1 * 3/2003 Nasu et al. .................... 372/32
2004/0036007 A1 * 2/2004 Wilson et al. ............... 250/205

FOREIGN PATENT DOCUMENTS

JP          11-251673         9/1999
JP          2001-284711 A    10/2001

* cited by examiner

Primary Examiner—Wilson Lee
Assistant Examiner—Leith Al-Nazer
(74) Attorney, Agent, or Firm—McDermott Will & Emery LLP

(57) ABSTRACT

A laser control circuit comprises a temperature control circuit and a data processing circuit. The temperature control circuit adjusts the temperature of a laser diode by controlling a temperature regulator. The data processing circuit receives the output of a wavelength monitor. The data processing circuit first adjusts the, temperature of the laser diode to a temperature value previously associated with the target wavelength. Then the data processing circuit finely adjusts the temperature of the laser diode according to the output of the wavelength monitor. Because rough adjustment has been carried out, it is not necessary to change the wavelength significantly according to the output of the wavelength monitor. Therefore, the periodic wavelength dependence of the output of the wavelength monitor does not decrease the accuracy of the control.

14 Claims, 3 Drawing Sheets

LASER CONTROL CIRCUIT AND LASER MODULE

BACKGROUND OF THE INVENTION

1. Field of the Invention

The present invention relates to a laser control circuit for controlling the output wavelength of a laser diode and to a laser module including the laser control circuit.

2. Related Background Art

A laser module is an optical device including a laser diode. The laser module is used, for example, as a light source for an optical communication system.

In a WDM communication system, the output wavelengths of the laser modules must be fixed. This is done to distinguish the communication channels from each other. In the WDM communication system, a plurality of communication channels with different wavelengths are used at the same time. The laser modules are used as light sources for such communication channels. Each communication channel is allocated to each wavelength band. Therefore, it is necessary to fix the output wavelengths of the laser modules in order to distinguish the channels by the wavelengths.

A wavelength monitor is sometimes disposed in the laser module to monitor the output wavelength. Such monitoring makes it possible to check whether the light with an appropriate wavelength is emitted.

SUMMARY OF THE INVENTION

The present invention may provide a method for accurately controlling the output wavelength of a laser diode and provide a so-controlled laser module.

The method in accordance with the present invention controls the output wavelength of a laser module to a target wavelength. The module comprises a laser diode for emitting light, a temperature regulator, a wavelength monitor for monitoring a wavelength of the light, a temperature control circuit for adjusting a temperature of the laser diode and a data processing unit connected to the temperature control circuit. The method comprises the steps of a) transmitting a first data from the data processing unit to the temperature control circuit, the first data corresponding to a first temperature, b) controlling the temperature regulator in response to the first data so that the temperature of the laser diode becomes the first temperature, c) transmitting a second data from the data processing unit to the temperature control circuit after the temperature of the laser diode has been adjusted to the first temperature, the second data indicating a second temperature, d) controlling the temperature regulator in response to the second data so that the temperature of the laser diode becomes the second temperature, and e) feedback controlling the second temperature according to the output of the wavelength monitor so that the output wavelength of the laser module becomes the target wavelength.

The method of the present invention performs to control temperatures in two stages. In the first stage, the temperature of the laser diode is adjusted to the first temperature. The first temperature is fixed and corresponds to the target wavelength. In the second stage, the temperature of the laser diode is adjusted to a second temperature that is variable and feedback controlled based on the output of the wavelength monitor. The first stage roughly adjusts the temperature of the laser diode. The first stage makes the temperature of the laser diode close to the temperature at which light with the target wavelength is emitted. In the second stage, the temperature of the laser diode is finely adjusted based on the output of the wavelength monitor.

The control in the first stage does not depend on the output of the wavelength monitor. Therefore, even when the output characteristic of the wavelength monitor exhibits periodic dependence on the wavelength of the laser light, the control is not affected by this wavelength dependence. Because the output wavelength of the laser diode is close to the target wavelength in the first stage, it is not necessary to change the wavelength significantly in the second stage. Thus the periodic wavelength dependence of the output of the wavelength monitor does not cause a problem. The method of the present invention can accurately control the output wavelength of the laser diode.

The module may further comprises a storage device connected to the data processing unit for storing reference data to associate the output wavelength of the laser diode with the temperature of the laser diode. The first temperature may be associated with the target wavelength according to the reference data. The reference data may be obtained by measuring the temperature and output wavelength of a laser diode identical or equivalent to the laser diode to be controlled.

The module may further comprise a temperature monitor for monitoring the temperature of the laser diode. The data processing unit compares the output of the temperature monitor with the first temperature after transmitting the first data to the temperature control circuit, and generates the second data when a difference between the output of the temperature monitor and the first temperature is no more than a predetermined range.

The temperature control circuit may receive the output of the wavelength monitor and feedback control the temperature of the laser diode according to the output of the wavelength monitor. Any feedback control method can be used. When the temperature control circuit performs the feedback control, the temperature of the laser diode is stabilized at the first or second temperature. As a result, the accuracy of the wavelength control is increased.

The data processing unit may be a digital processor and the temperature control circuit may be an analog circuit. The data processing unit may further comprise a digital-to-analog converter for connecting the digital processor to the temperature control circuit for converting an output of the digital processor into an analog signal to transmit the analog signal to the temperature control circuit. In this case, switching from a temperature to another temperature is digitally processed by the digital processor. The circuit size can be easily reduced by comparison with the case when switching between the temperatures is carried out by an analog process.

The laser module in accordance with the present invention outputs light with a target wavelength. The module comprises: a laser diode for outputting light with an wavelength at a temperature; a wavelength monitor optically coupled with the laser diode for generating an output changing according to the wavelength of the light output from the laser diode; a temperature monitor thermally coupled with the laser diode; a temperature regulator thermally coupled with the laser diode; and a control circuit for controlling the wavelength of the output light of the laser diode. The control circuit has a temperature control circuit for adjusting the temperature of the laser diode by controlling the temperature regulator, and a data processing unit connected to the temperature control circuit for receiving the output of the wavelength monitor, and for generating and transmitting a first data to the temperature control circuit. The first data corresponds to a first temperature associated with the target wavelength.

The temperature control circuit controls the temperature regulator in response to the first data so that the temperature of the laser diode becomes the first temperature. The data processing unit generates and transmits a second data indicating a second temperature to the temperature control circuit after the temperature of the laser diode has been adjusted to the first temperature, and the temperature control circuit controls the temperature regulator in response to the second data so that the temperature of the laser diode becomes the second temperature. The data processing unit feedback controls the second temperature according to the output of the wavelength monitor so that the output wavelength of the laser diode becomes the target wavelength.

The data processing unit may generate the first data when the laser module turns on or when the output wavelength of the laser diode is switched.

The wavelength monitor may comprise an optical element for receiving light output from the laser diode to generate light with periodic dependence on a wavelength of the received light, and a photodetector for receiving the generated light. The optical element may be an ethalon or optical filter.

Further scope of applicability of the present invention will become apparent from the detailed description given hereinafter. However, it should be understood that the detailed description and specific examples, while indicating preferred embodiments of the invention, are given by way of illustration only, since various changes and modifications in the spirit and scope of the invention will become apparent to those skilled in the art from this detailed description.

DESCRIPTION OF THE PREFERRED EMBODIMENTS

Figure 1:
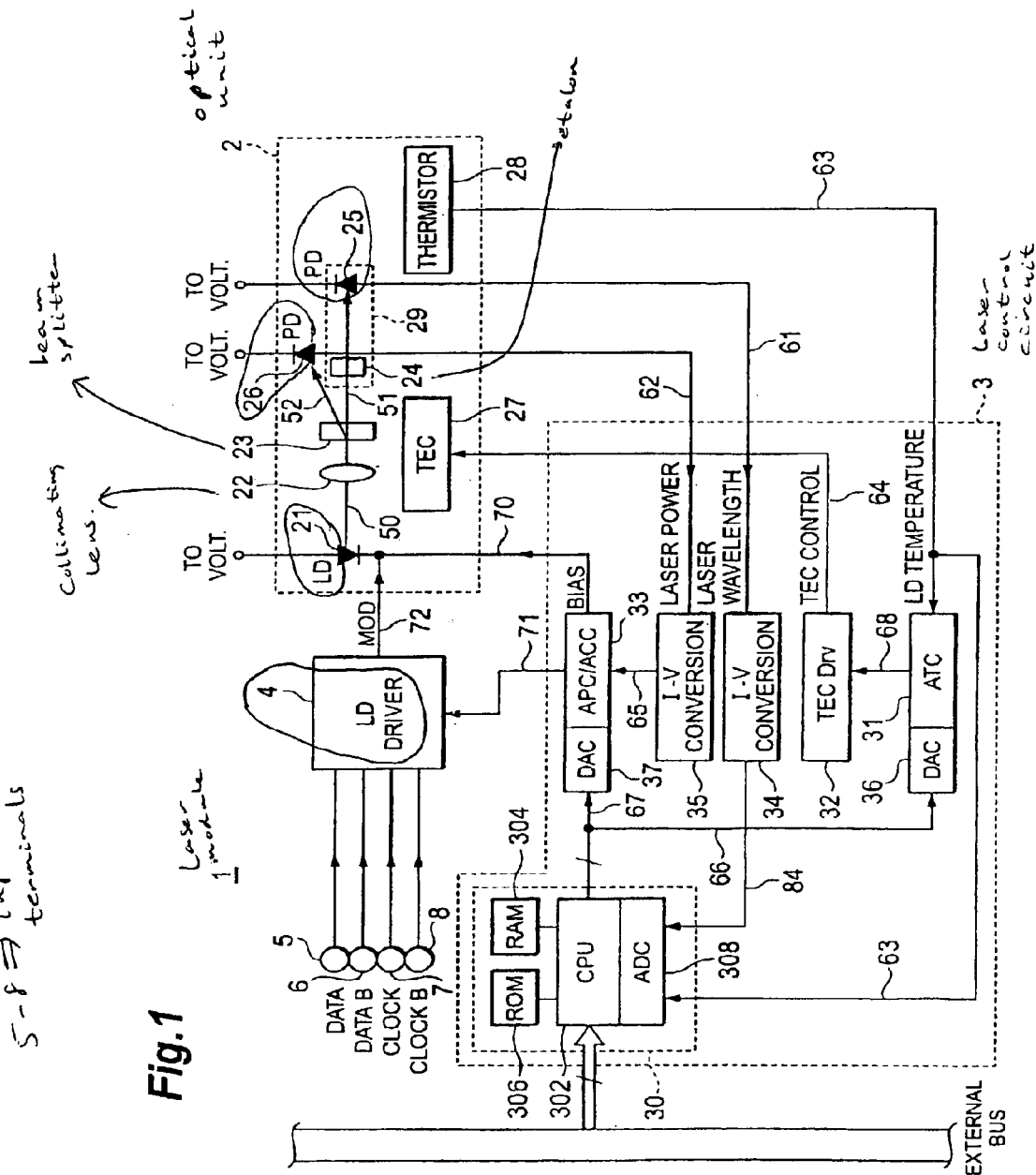
FIG. 1 is a block diagram illustrating the configuration of the laser module in accordance with an embodiment of the invention.

The preferred embodiments of the present invention will be described below in greater detail with reference to the accompanying drawings. In the drawings, identical numerals have been used to designate identical or equivalent elements that are common to each other without repeating the overlapping descriptions.

FIG. 1 is a block-diagram illustrating the configuration of the laser module of the present embodiment. A laser module 1 comprises an optical an optical unit 2, a laser control circuit 3, and a LD driver 4. Those components are enclosed in a housing (not shown in the figures). The optical unit 2, laser control circuit 3, and LD driver 4 are electrically connected to each other. Laser module 1 also comprises input terminals 5 to 8. The input terminals 5 and 6 are for data signals, and the input terminals 7 and 8 are for clock signals. The input terminals 5 to 8 are electrically connected to the LD driver 4.

The optical unit 2 comprises a LD 21, a collimator lens 22, a beam splitter 23, an ethalon 24, and photodiodes (represented by PD hereinbelow) 25 and 26. The LD 21 is electrically connected to the laser control circuit 3 and LD driver 4. One terminal of the LD 21 is connected to an external voltage source. The collimator lens 22 is optically coupled with the LD 21. The collimator lens 22 is positioned so as to receive laser beam 50 from the LD 21. The beam splitter 23 is optically coupled with the collimator lens 22. The beam splitter 23 is positioned so as to receive laser beam from the collimator lens 22. The ethalon 24 and PD 26 are optically coupled with the beam splitter 23. The ethalon 24 and PD 26 are positioned so as to receive two laser beams 51 and 52 from the beam splitter 23, respectively. The PD 25 is optically coupled with the ethalon 24. The PD 25 is positioned so as to receive the laser beam 51 transmitted through the ethalon 24. The PD 25 and 26 are connected to an external voltage source.

The LD 21 is a semiconductor light-emitting element for generating a laser beam. This laser beam is an output beam of the laser module 1. The collimator lens 22 receives the laser beam 50 emitted from the LD 21 and converts it into a parallel beam. The beam splitter 23 receives the laser beam 50 transmitted through the collimator lens 22 and splits it in two beams. One beam 51 enters the ethalon 24. The other beam 52 directly enters the PD 26.

The ethalon 24 causes interference by multiple reflection between the light incident surface and the light exit surface. Since the interval of the interference depends on the wavelength of the laser and the spacing between the surfaces of the ethalon and the interference changes periodically, the magnitude of the light transmitted through the ethalon depends on the wavelength of the laser.

The PD 25 is a photodetector for receiving a portion of the light transmitted through the ethalon 24. The PD 25 generates and outputs an electric current 61 by photoelectric conversion effect. The output electric current 61 is supplied to the laser control circuit 3.

Figure 2:
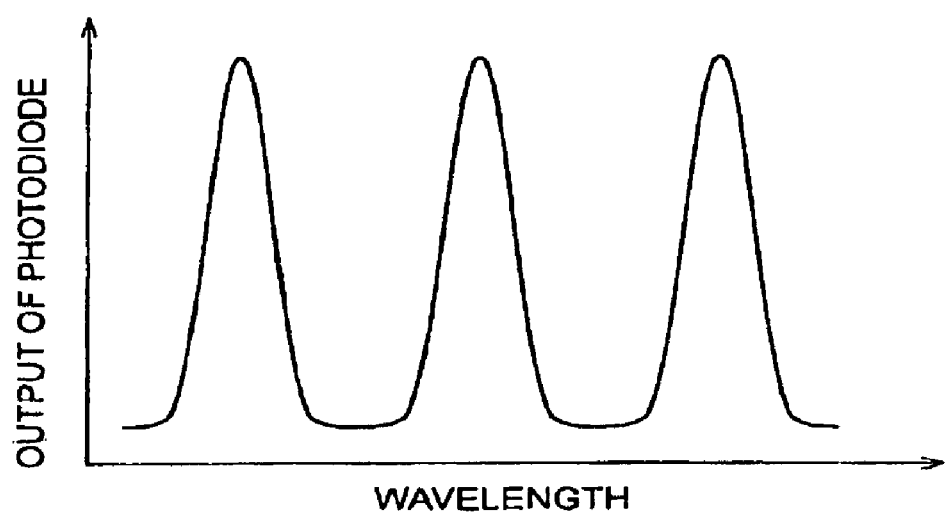
FIG. 2 is a graph showing the wavelength—output characteristic of the wavelength monitor.

FIG. 2 illustrates the relationship between the wavelength of the laser and the output 61 of the PD 25. As shown in FIG. 2, the output 61 changes periodically according to the wavelength of the laser. This is because the magnitude of the incident light to the PD 25 changes periodically depending on the wavelength of the laser beam. Thus the ethalon 24 and PD 25 serve as a wavelength monitor 29 because the output of the PD 25 depends on the wavelength. The magnitude of the output 61 of the wavelength monitor 29 corresponds to the output wavelength of the LD 21. That is, the wavelength monitor 29 generates an output corresponding to the output wavelength of the LD 21 and transmits the output to the laser control circuit 3.

Referring again to FIG. 1, the PD 26 is a photodetector for receiving the laser beam 52 split by the beam splitter 23. The output 62 of the PD 26 corresponding to the laser beam 52 is supplied to the laser control circuit 3. The PD 26 serves as a power monitor of the LD 21.

The optical unit 2 further includes a temperature regulator 27 and a temperature monitor 28. The temperature regulator 27 and temperature monitor 28 are placed close to the LD 21 and are thermally connected to the LD 21. The temperature regulator 27 and temperature monitor 28 are electrically connected to the laser control circuit 3.

The temperature regulator 27 receives a control signal 64 from the control circuit 3 and adjusts the temperature of the LD 21 according to the signal 64. In the present embodiment, a Peltier element is used as the temperature regulator 27. In this case, the control signal 64 is an driving current of the Peltier element 27. The Peltier element cools when the driving current 64 flows in a certain direction and heats when the driving current 64 flows in the opposite direction. The cooling or heating depends on the magnitude of the driving current 64. The control circuit 3 can control the temperature of the LD 21 by adjusting the magnitude of the driving current 64.

The temperature monitor 28 measures the temperature of the LD 21. The temperature monitor 28 is placed close to the LD 21 so as to be thermally coupled with the LD 21. The temperature monitor 28 sends a signal 63 corresponding to the temperature of the LD 21 to the control circuit 3. A thermistor can be used as the temperature monitor 28.

The control circuit 3 will now be described. The control circuit 3 comprises an arithmatic processing unit 30, an automatic temperature control circuit 31, and a Peltier drive circuit 32. The arithmatic processing unit 30 is connected to the temperature control circuit 31 and thermistor 28. The temperature control circuit 31 is connected to the Peltier drive circuit 32 and thermistor 28. The Peltier drive circuit 32 is connected to the Peltier element 27.

The arithmatic processing unit 30 comprises a CPU 302, a RAM 304, an ROM 306, and an A/D converter 308. The CPU 302 is connected to the RAM 304, ROM 306, and A/D controller 308. The CPU 302 is a digital processor for processing a variety of data and controlling the entire operation of the control circuit 3. The RAM 304 is a main memory unit used by the CPU 302. The RAM 304 stores a variety of data to be processed by the CPU 302. The ROM 306 is a non-volatile memory storing a program executed by the CPU 302 and the reference data used by the CPU 302. The CPU 302 controls the operation of the control circuit 3 according to this program. The reference data associates the output wavelength of the LD 21 with the temperature of the LD 21. The reference data will be described below. The A/D converter 308 is electrically connected between the CPU 302 and thermistor 28. The A/D converter 308 converts the output current 63 from the thermistor 28 in an analog form into a digital signal. The signal converted to the digital form is transmitted to the CPU 302.

Temperature control circuit 31 controls the temperature of the LD 21 through adjusting the temperature of the Peltier element 27. The target temperature is indicated by the arithmatic processing unit 30. The temperature control circuit 31 is an analog circuit. The D/A converter 36 is connected to the CPU 302 and also the temperature control circuit 31. The D/A converter 36 converts the output signal 66 from the CPU 302 into an analog signal. The analog signal is sent from the D/A converter 36 to the temperature control circuit 31.

The temperature control circuit 31 generates an analog signal 68 corresponding to the target temperature and sends this signal to the Peltier drive circuit 32. The voltage signal 68 indicates the degree of cooling or heating by the Peltier element 27. The degree of cooling or heating is determined based on the difference between the ambient temperature and the target temperature. The algorithm of the operation to determine the degree of cooling or heating will be explained below in detail.

The temperature control circuit 31 receives the output of the thermistor 28. This output corresponds to the measured temperature of the LD 21. The temperature control circuit 31 feedback controls the cooling/heating operation of the Peltier element 27 so that the temperature of the LD 21 approaches the target temperature. The temperature control circuit 31 compares the measured temperature of the LD 21 with the target temperature and adjusts the degree of cooling according to the result of the comparison. If the measured temperature is higher than the target temperature, the cooling is intensified. Conversely, if the measured temperature is lower than the target temperature, the cooling is weakened or the heating is carried out. Such a feedback control stabilizes the temperature of the LD 21 at the target temperature. Any feedback control method, such as proportional-integral control, can be used.

Referring to FIG. 1 again, the Peltier drive circuit 32 generates the driving current 64 of the Peltier element 27 in response to the signal 68. The driving current 64 is supplied to the Peltier element 27. The Peltier element 27 cools or heats the LD 21 according to the direction of the driving. The Peltier drive circuit 32 is an analog circuit.

The control circuit 3 further includes an power control circuit 33 and current—voltage conversion circuits (I-V converters) 34 and 35. The power control circuit 33 is connected to the arithmatic processing unit 30 and LD 21. The I-V converter 34 is connected to the PD 25 and arithmatic processing unit 30. The I-V converter 35 is connected to the PD 26 and power control circuit 33.

The power control circuit 33 (APC) controls the optical output power of the LD 21. The target value of the output power of the LD 21 is indicated by the arithmatic processing unit 30. Namely, the CPU 302 transmits an output 67 corresponding to the target optical power to the power control circuit 33. The power control circuit 33 generates and supplies a bias current 70 for the LD 21. Further, the power control circuit 33 supplies a preset signal 71 for modulation current of the LD 21 to the LD driver 4. The preset signal 71 determines a modulation current 72 of the LD 21. The power control circuit 33 is an analog circuit. A D/A converter 37 connects the CPU 302 to the power control circuit 33. The D/A converter 37 converts the digital signal 67 from the CPU 302 into an analog signal. The analog signal is sent from the D/A converter 37 to the power control circuit 33.

The I-V converter 34 converts the output current 61 of the PD 25 into an voltage signal 84. This voltage signal 84 is sent to the A/D converter 308 in the arithmatic processing unit 30. The A/D converter 308 converts the analog signal 84 into a digital form and sends the digitized signal to the CPU 302. Thus, the CPU 302 receives the output of the wavelength monitor 29.

The I-V converter 35 converts the output current 62 of the PD 26, which is the optical power monitor, into a voltage signal 65. This voltage signal 65 is sent to the power control circuit 33. As described above, the output current 62 of the PD 26 corresponds to the optical output power of the LD 21. Therefore, the power control circuit 33 receives the output power of the LD 21 from the PD 26 via the I-V converter 35.

The power control circuit 33 feedback controls the output power of the LD 21 according to the measured output power and target power, that is, the output of the D/A converter 37. The measured output power and target power are compared and the bias current 70 and preset signal 71 are adjusted according to the comparison. Such a feedback control stabilizes the output power of the LD 21 at the target value. Any feedback control, such as proportional-integral control, can be used.

The LD driver 4 supplies the modulation current 72 to the LD 21. Data signals and clock signals are supplied from an external signal generator (not shown in the figures) to the LD driver 4. The signal generator is connected to the input terminals 5 to 8 of the laser module 1. The LD driver 4 receives two data signals complementary to each other at input terminals 5 and 6, respectively, and two clock signals complementary to each other at input terminals 7 and 8, respectively. The LD driver 4 generates the modulation current 72 corresponding to the data signals and clock signals. The magnitude of the modulation current 72 is determined by the preset signal 71 supplied from the power control circuit 33.

Figure 3:
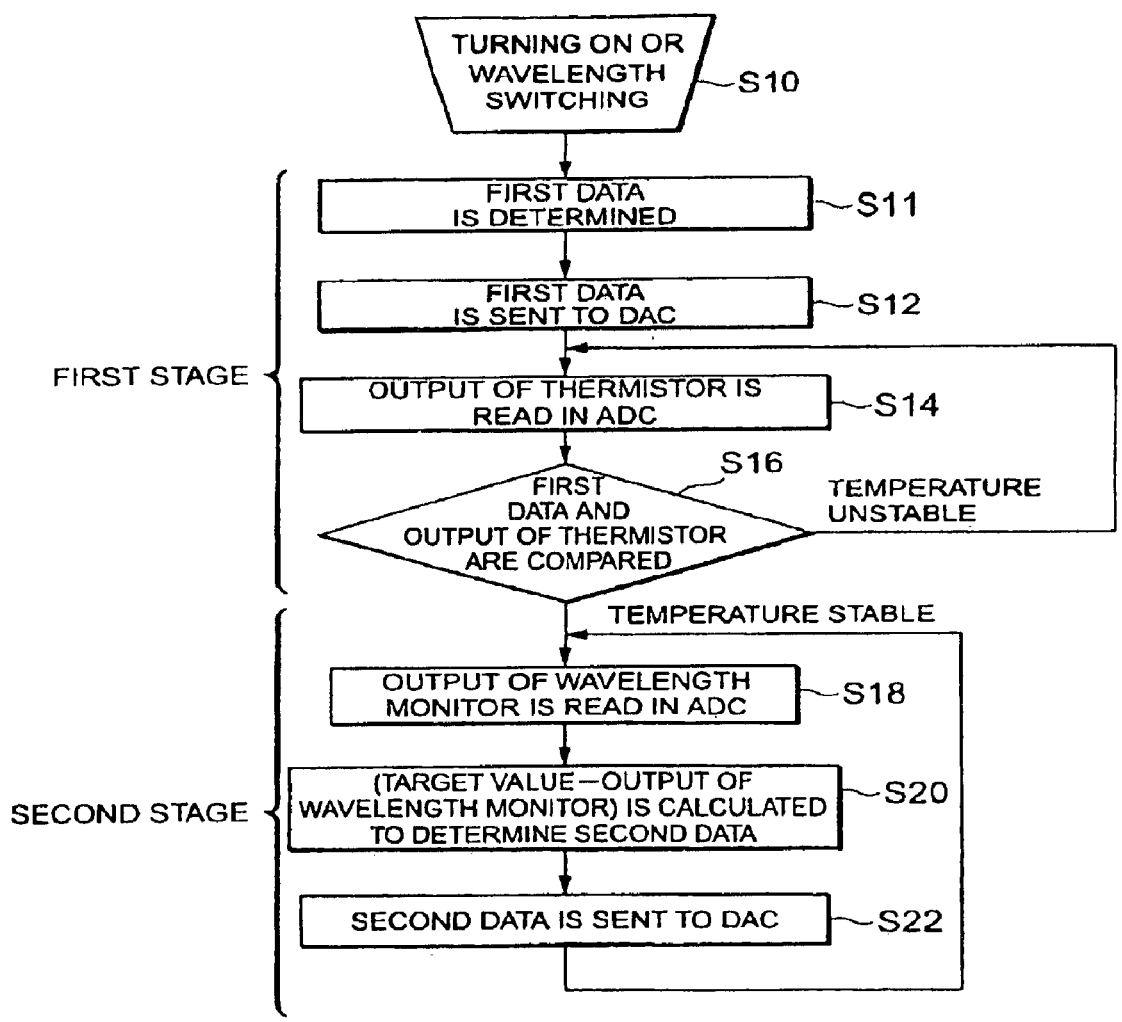
FIG. 3 is a flowchart showing the wavelength control process.

Referring to FIG. 3, the wavelength control by the control circuit 3 will be described. FIG. 3 is a flowchart showing the control process of the output wavelength of the LD 21. This process comprises at least two stages. In the first stage, the temperature of the LD 21 is adjusted to the temperature associated with the target wavelength, the relation of which to the temperature is determined in beforehand. In the second stage, the temperature of the LD 21 is adjusted so that the output of the wavelength monitor 29 indicates the target wavelength. The first stage is a coarse adjustment while the second stage is a fine adjustment.

The wavelength control process starts when the laser module 1 turns on or when the output wavelength is switched (step S10). Namely, when the module turns on, a preset wavelength serves as a target wavelength. The preset wavelength, for example, may be the wavelength at which the module turns off. The preset wavelength may be stored in the ROM 306. In the case that the target wavelength is switched, the wavelength there of indicated by the user serves as the target wavelength. Under the operation of the laser module 1, a primary controller not shown in FIG. 1 is connected to the laser module 1. The user may indicate the target wavelength from the primary controller. The target wavelength is transmitted from the primary controller to the CPU through the external bus and stored in the ROM 306.

The first stage of the control process comprises steps from S11 to S16 in FIG. 3. The CPU 302 sets a first data corresponding to the target wavelength (S11), which is determined according to the reference data for associating the temperature with the output wavelength of the LD 21. The reference data is stored in the ROM 306. The CPU 302 reads the data to determine the first data corresponding to the target temperature.

The reference data may be, for example, a table storing the temperature in correspondence to the target wavelength, or a function for determining the temperature with target wavelength as an argument. The reference data is obtained by measuring the relation between the temperature and the output wavelength of the LD identical or equivalent to the LD to be wavelength controlled. The reference data may be used for estimating the output wavelength of the LD 21 at a certain temperature.

The CPU 302 outputs the first data to the Digital-to-Analog (D/A) converter 36. The D/A converter 36 converts the first data into an analog form and transmits it to the temperature control circuit 31. In response to the first data, the temperature control circuit 31 stabilizes the temperature of the LD 21 to the temperature corresponding to the first data.

The CPU 302 stands until the temperature of the LD 21 is set to the temperature corresponding to the first data. Namely, the CPU 302 receives the output of the thermistor 28 via the Analog-to-Digital (A/D) converter 308 (step 14). This output indicates the actual temperature of the LD 21. The CPU compares the output of the thermistor 28 with the first data at step 16. By such comparison, the CPU 302 determines whether the temperature of the LD 21 is close to the first data. Processes of the step S14 and S16 are repeated as long as the difference between the output of the thermistor and the first data exceeds a predetermined range. Once the difference goes within the range, the CPU starts the step S18.

The second stage comprises the steps from S18 to S22. In the second stage, the temperature of the LD 21 is feedback controlled according to the output of the wavelength monitor 29. The proportional-integral control may be used as the feedback control.

The CPU 302 receives the output of the wavelength monitor via the A/D converter 308 at step S18. The CPU 302 calculates a second data based on the output of the wavelength monitor 29 and the target value that corresponds to the value when the LD 21 emits light with the target wavelength. The CPU subtracts those values in accordance with a predetermined formula to determine the second data so as to decrease the difference between the output of the wavelength monitor and the target value. Similarly to the first data, the second data indicates a specific temperature of the LD 21. Although both data are not identical to the actual temperature of the LD 21, there is one-to-one correspondence between these data and the temperature of the LD 21.

The CPU 302 outputs the second data to the D/A converter 36. The D/A converter 36 converts the digital signal into an analog form and sends it to the temperature control circuit 31. The temperature control circuit 31 feedback controls the temperature of the LD 21, accordingly.

The CPU 302 repeats the steps from S18 to S22 until the laser module 1 is turned off or a new indication to switch the output wavelength is received. The step S20 determines the second data so as to decrease the difference between the wavelength actually measured by the wavelength monitor 29 and the target wavelength. Thus, in the second stage, the CPU 302 and the temperature control circuit 31 perform double feedback control.

The advantages of the laser control circuit 3 will now be described. The laser control circuit 3 at least has the following two advantages.

First, the control circuit 3 can accurately control the output wavelength of the LD 21. This is because the control circuit 3 performs the two-stage control. In the first stage, the output wavelength of the LD 21 is roughly adjusted according to the reference table. In the second stage, the temperature and output wavelength of the LD 21 are finely adjusted so that the output of the wavelength monitor 29 becomes the target wavelength. In the first stage, since the output of the wavelength monitor 29 is not used, the periodic characteristic of the output of the wavelength monitor does not cause any problem. Since the temperature of the LD 21 approaches the appropriate temperature in the first stage, it is not necessary to change the output wavelength of the LD 21 significantly in the second stage. Consequently, the output wavelength of the LD 21 can be controlled with good accuracy when the laser module is turned on or when the output wavelength of the module is switched.

Second, the size of the control circuit 3 can be reduced. This is because the target temperature value of the LD 21 is switched digitally between the first and second stages of the control. This will be described below in detail.

The laser control circuit in accordance with the present invention may have an analog arithmatic processing unit instead of the digital arithmatic processing unit 30. The analog data processing circuit, instead of the CPU 302, performs the feedback control of the second temperature. When the temperature control circuit 31 feedback controls the temperature of the LD 21, double feedback control can be carried out similarly to the above-described embodiment.

However, when the double feedback control is carried out using only an analog circuit, it is necessary to adjust time constants in the feedback loops. The feedback circuit controlling the second temperature according to the output of the wavelength monitor requires phase compensation larger than that required by the feedback circuit stabilizing the temperature of the LD 21. This is because the feedback control performed by the former involves the feedback control performed by the latter. For this reason, the data processing circuit has to set a time constant much larger than that of the temperature control circuit 31, which, makes the circuit size larger.

When only an analog circuit is adopted for changing the first temperature to the second temperature, various circuits must be required, such as the first for generating a signal corresponding to the first temperature, that for the second temperature, the switching circuit, and the circuit for controlling thereof. This enlarges the size of the control circuit.

Switching the target temperature digitally enhances the accuracy of the wavelength control. This can be understood by comparing the case that switching of the target temperature is performed by analog processing. When the switching to the target temperature is carried out by the analog processing, it takes time to generate the signal corresponding to the correct target temperature due to the transition effect of the analog circuit. Since the analog circuit includes an amplifier, the difference between the correct level and the level of the setting signal during the transition is large. If such a setting signal is supplied to the temperature control circuit 31, the wavelength control of the first stage may be out of the function. In the present embodiment, the above-described problems can be avoided because the target temperature is switched digitally.

The present invention has been explained in detail hereinabove based on the embodiment thereof. However, the present invention is not limited to the embodiment. Various modifications may be possible without departing from the scope thereof.

In the above embodiment, the wavelength monitor comprises an ethalon and a PD. However, the optical element disposed between the PD and LD is not limited to the ethalon. The wavelength monitor can also be formed using an optical element for providing the variable intensity for incident light with periodic dependence on the wavelength. One example of this type of the optical element is an optical filter changing its transmittance periodically according to the wavelength of the incident light.

In the above embodiment, the CPU 302 performs proportional-integral control. However, feedback control of another type may also be adopted. For example, the CPU 302 may compare the output of the wavelength monitor 29 with the target wavelength, and add, or subtract, a predetermined correction to, or from, the present temperature when the difference between the compared two values exceeds a predetermined value.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for controlling an output wavelength of a laser module to a target wavelength, the module comprising a laser diode for emitting light, a temperature regulator, a wavelength monitor for monitoring a wavelength of the light, a temperature control circuit for adjusting a temperature of the laser diode and a data processing unit connected to the temperature control circuit; the method comprising the steps of:
   a) transmitting a first data from the data processing unit to the temperature control circuit, the first data corresponding to a first temperature;
   b) controlling the temperature regulator in response to the first data so that the temperature of the laser diode becomes the first temperature;
   c) transmitting a second data from the data processing unit to the temperature control circuit after the temperature of the laser diode has been adjusted to the first temperature, the second data indicating a second temperature;
   d) controlling the temperature regulator in response to the second data so that the temperature of the laser diode becomes the second temperature; and
   e) feedback controlling the second temperature according to the output of the wavelength monitor so that the output wavelength of the laser module becomes the target wavelength.

2. A method for controlling an output wavelength of a laser module according to claim 1,
   wherein the module further comprises a storage device connected to the data processing unit for storing reference data to associate the output wavelength of the laser diode with the temperature of the laser diode, the first temperature being associated with the target wavelength according to the reference data.

3. A method for controlling an output wavelength of a laser module according to claim 1,
   wherein the module further comprises a temperature monitor for monitoring the temperature of the laser diode, and
   wherein the data processing unit compares the output of the temperature monitor with the first temperature after transmitting the first data to the temperature control circuit, and generates the second data when a difference between the output of the temperature monitor and the first temperature is no more than a predetermined range.

4. A method for controlling an output wavelength of a laser module according to claim 1,
   wherein the temperature control circuit receives the output of the wavelength monitor and feedback controls the temperature of the laser diode according to the output of the wavelength monitor.

5. A method for controlling an output wavelength of a laser module according to claim 1,
   wherein the data processing unit is a digital processor and the temperature control circuit is an analog circuit, and
   wherein the data processing unit further comprises a digital-to-analog converter for connecting the digital processor to the temperature control circuit for converting an output of the digital processor into an analog signal to transmit the analog signal to the temperature control circuit.

6. A laser module for outputting light with a target wavelength, the laser module comprising:
   a laser diode for outputting light with an wavelength at a temperature;
   a wavelength monitor optically coupled with the laser diode for generating an output changing according to the wavelength of the light output from the laser diode;
   a temperature monitor thermally coupled with the laser diode;

a temperature regulator thermally coupled with the laser diode; and a control circuit for controlling the wavelength of the output light of the laser diode, the control circuit having:

a temperature control circuit for adjusting the temperature of the laser diode by controlling the temperature regulator; and a data processing unit connected to the temperature control circuit for receiving the output of the wavelength monitor, and for generating and transmitting a first data to the temperature control circuit, the first data corresponding to a first temperature associated with the target wavelength, wherein the temperature control circuit controls the temperature regulator in response to the first data so that the temperature of the laser diode becomes the first temperature, wherein the data processing unit generates and transmits a second data indicating a second temperature to the temperature control circuit after the temperature of the laser diode has been adjusted to the first temperature, and the temperature control circuit controls the temperature regulator in response to the second data so that the temperature of the laser diode becomes the second temperature, and wherein the data processing unit feedback controls the second temperature according to the output of the wavelength monitor so that the output wavelength of the laser diode becomes the target wavelength.

7. A laser module according to claim 6, wherein the module further comprises a storage device connected to the data processing unit for storing reference data to associate the output wavelength of the laser diode with the temperature of the laser diode, the first temperature being associated with the target wavelength according to the reference data.

8. A laser module according to claim 6, wherein the data processing unit compares the output of the temperature monitor with the first temperature after transmitting the first data to the temperature control circuit, and generates the second data when a difference between the output of the temperature monitor and the first temperature is no more than a predetermined range.

9. A laser module according to claim 6, wherein the temperature control circuit receives the output of the wavelength monitor and feedback controls the temperature of the laser diode according to the output of the temperature monitor.

10. A laser module according to claim 6, wherein the data processing unit is a digital processor and the temperature control circuit is an analog circuit, and wherein the data processing unit further comprises a digital-to-analog converter for connecting the digital processor to the temperature control circuit for converting an output of the digital processor into an analog signal to transmit the analog signal to the temperature control circuit.

11. A laser module according to claim 6, wherein the data processing unit generates the first data when the laser module turns on or when the output wavelength of the laser diode is switched.

12. A laser module according to claim 6, wherein the wavelength monitor comprises an optical element for receiving light output from the laser diode to generate light with periodic dependence on a wavelength of the received light, and a photodetector for receiving the generated light.

13. A laser module according to claim 12, wherein the optical element is an ethalon.

14. A laser module according to claim 12, wherein the optical element is an optical filter.

* * * * *